United States Patent [19]

Stone

[11] Patent Number: 4,778,563

[45] Date of Patent: Oct. 18, 1988

[54] MATERIALS AND METHODS FOR ETCHING TUNGSTEN POLYCIDES USING SILICIDE AS A MASK

[75] Inventor: Clark S. Stone, San Jose, Calif.

[73] Assignee: Applied Materials, Inc., Santa Clara, Calif.

[21] Appl. No.: 31,105

[22] Filed: Mar. 26, 1987

[51] Int. Cl.$^4$ .......................................... H01L 21/308
[52] U.S. Cl. ........................ 156/643; 156/646; 156/653; 156/657; 156/659.1; 156/662; 252/79.2
[58] Field of Search ............... 156/643, 646, 653, 657, 156/659.1, 662; 252/79.2

[56] References Cited

U.S. PATENT DOCUMENTS

| 4,422,897 | 12/1983 | Horwitz | 156/643 |
| 4,613,400 | 9/1986 | Tam et al. | 156/643 |
| 4,680,086 | 7/1987 | Thomas et al. | 156/643 |

Primary Examiner—David L. Lacey
Assistant Examiner—Andrew J. Anderson
Attorney, Agent, or Firm—Flehr, Hohbach, Test, Albritton & Herbert

[57] ABSTRACT

A polycide etch process using a SiCl$_4$:HCl reactive gas flow rate ratio of at least about 1:1 for etching the polysilicon without etching, notching or degrading the overlying silicide. Thus, after patterning the silicide using a photoresist mask, the silicide can be used as the mask for etching the polysilicon, thereby providing precise pattern transfer to the polysilicon, independent of photoresist degradation. Also, a thinner, more precisely patterned photoresist mask can be used.

6 Claims, 1 Drawing Sheet

MATERIALS AND METHODS FOR ETCHING TUNGSTEN POLYCIDES USING SILICIDE AS A MASK

BACKGROUND OF THE INVENTION

The present invention relates in general to a process for reactive ion etching (RIE) of conductive layers used in semiconductor integrated circuits (IC). In particular, the invention relates to methods for RIE mode plasma etching of silicides, polycrystalline silicone (polysilicon) and composite silicide-on-polysilicon structures (polycide), to the use of the silicide layer as an etch mask during etching of the polysilicon and to a reactive gas composition for use in such methods.

1. Scaled Device Requirements

As the device geometries employed in conductor-insulator-semiconductor field effect transistor and bipolar transistor devices are decreased to micron and submicron size, it becomes necessary to scale down the resistance of the associated conductors. Also, the lithographic pattern transfer process must be made increasingly precise. Regarding the need to scale resistances, the sheet resistance of interconnects must be scaled down to maintain device performance and at the same time the gate resistance must be lowered to maintain the required device speed.

Polycrystalline silicon or polysilicon has been and is widely used in both MOSFET and bipolar IC technology, for example, in conductors such as gate electrodes; in single level and multi-layer interconnects; in resistors; in buried contacts; and in the formation of emitter structures such as shallow self-aligned emitters and self-aligned emitter-contact structures. However, as device geometries shrink, it is increasingly difficult to simultaneously meet the gate and interconnect sheet resistance requirements and obtain anisotropic etch behavior and precise pattern transfer using highly doped polysilicon. Please note, as used here the term pattern transfer refers to the use of lithography to form a mask to a specific pattern on an integrated circuit, then replicating the mask pattern in the underlying layer or layers, typically by plasma etching or RIE mode plasma etching.

2 Polycide Satisfaction of Resistance Requirements

Increasingly, the micro-electronics industry has used polycide technology for a number of IC applications. Polycide is a layer of metal silicide over a layer of polysilicon. Of primary interest here are the refractory metal slicides (typically, disilicides): titanium silicide, $TiSi_x$; tantalum silicide, $TaSi_x$; molybdenum silicide, $MoSi_x$; tungsten silicide, $WSi_x$; the polycides of these refractory metal silicides; and, in particular, tungsten silicide and tungsten polycide. Typically, in the basic two-layer polycide structure, the polysilicon underlayer is moderately to heavily doped (for example, 20 to 50 ohms/square) and is formed to a thickness of about 1,500 to 3,500 Angstroms, while the silicide overlayer may be about the same thickness of the poly underlayer.

The silicide/polysilicon polycide structure meets both resistance scaling requirements. That is, polycide provides suitably low interconnect sheet resistance for maintaining device performance and suitably low gate resistance for providing fast operating speeds. In this structure, the silicide decreases the resistivity while the polysilicon maintains the physical integrity of the conductor.

3. Polycide Etch Requirements

There are a number of requirements which apply to the etching of polycide conductor structures. Referring to FIG. 1, there is shown a masked polycide conductor structure 10 prior to etching. The structure comprises a photoresist mask 11; a polycide sandwich 12 comprising a silicide overlayer 13 and a polysilicon underlayer 14; and a thin oxide layer 16, typically a gate oxide layer, all formed on silicon sunbstrate 17.

In general it is highly desirable that the silicide 13 and the polysilicon 14 be etched to an anistropic vertical profile (see, e.g., FIG. 3B) with a minimum dimensional/line width loss in the masking layer 11 and the underlying conductor layers 13 and 14. (The ability to selectively form vertical and sloping anisotropic profiles also may be useful.) Moreover, it is important to produce a residue-free etch in which no filaments are left along the topography and there is no redeposition or field residue. For adequate throughput, the process should provide moderate-to-high rate removal of the silicide 13 and the polysilicon 14 during their respective etching. At least during the polysilicon overetch (i.e., during that portion of the polysilicon etch after the underlying oxide 16 is exposed) high selectivity to oxide is critical to clear the topography of residue without etching through or degrading the thin oxide layer 16.

At least in part because of the problems in simultaneously satisfying various ones of the above objectives (such as obtaining silicide and polysilicon anisotropy and maintaining high selectivity to oxide) using a single step etch process, the art typically has used a minimum of two process steps to separately etch the silicide and polysilicon constituents of the polycide sandwich structure. In addition, frequently, an additional process step is used to clean the surface 18, FIG. 1, of contaminants and native oxide prior to etching the silicide and polysilicon.

4. Photoresist Erosion

Another problem encountered in polycide etching results from the etching and tapering and lateral dimensional loss of the photoresist mask and the resulting erosion of the silicide during the etching of the polysilicon. FIGS. 2 and 3 schematically depict an idealized sequence of the process of replicating and transferring the pattern of the mask 11, FIG. 1, to the silicide 13, FIG. 2, and then to the polysilicon 14, FIG. 3, by etching. Conventionally, the photoresist 11 is used as the etch mask during the etching of both the silicide 13 and the polysilicon 14, and also during the poly overetch. The problem occurs because the chlorinated etchants used to pattern the polysilicon 14 inherently etch the silicide as well. Thus, to accurately reproduce the pattern of the mask 11 in the poly 14 without degradation of the silicide 13 requires that the mask be sufficiently thick so that it does not erode to the point of exposing the silicide. That is, the initial mask thickness t, FIG. 1, and the initial inherent sidewall slopes of the mask, measured by angle $\alpha$, FIG. 1, must be equal to or greater than certain minimum values.

Referring further to FIG. 3, when the minimum thickness t and sidewall slop angle $\alpha$ specifications are satisfied, the photoresist 11 effectively protects the silicide 13 from notching, lateral dimension losses and other etching degradation and permits a relatively precise transfer of the mask 11 lateral dimensions to the polysilicon 14. In one exemplary MOSFET process, the minimum specifications for the mask thickness and sidewall angles are $t_{min}=1.2$ microns (12,000 Angstroms) and $\alpha_{min}=85°$. Typically, $t_{min}$ ranges from 8500 Angstroms to 14,000 Angstroms and $\alpha_{min}$ ranges from 65° to 90°, both being dependent upon topographical steps and lithographic resolution.

However, where the thickness t and/or the slope angle $\alpha$ are below the required minimum values, the mask 11 will be etched through at the edges and in turn will allow etching and notching of the underlying silicide 13, with resulting line width/dimensional loss and increased conductor resistance. These effectds are depicted in FIG. 3A, wherein the photoresist mask 11A has been etched/degraded by the silicide etch and the underlying silicide 13A is notched, as indicated at 19. In short, this mask degradation results in decreased precision in the photolithographic transfer process as well as dimensional loss in the silicide and increased electrical resistance of the silicide.

A useful polycide etch process is disclosed in copending, commonly assigned U.S. patent application Ser. No. 786,783, now abandoned, entitled "Materials and Methods for Etching Silicides, Polycrystalline Silicon and Polycides", filed Oct. 11, 1985, in the name of Wang et al, which application is hereby incorporated by reference in its entirety. (This patent application is also referred to as the referenced Wang et al silicide/polycide etch patent application.)

The referenced Wang et al silicide/polycide etch process uses HCl and $Cl_2$ as the basic gas chemistry for etching both refractory metal silicides and polysilicon in an essentially continuous silicide and polysilicon etch process in the same etch chamber without breaking vacuum. This multi-step process provides high silicide:-polysilicon etch rate ratios, which are desirable for steep step topographies.

Referring to FIG. 2, the silicide 13 is etched using $BCl_3$-containing $HC/Cl_2$ gas chemistry (i.e., the base gas chemistry is $HCl/BCl_3/Cl_2$) selectively doped as required with relatively small volumetric amounts of dopant gas. Specifically, for titanium silicide, $TiSi_x$, and tantalum silicide, $TiSi_x$, high silicide etch rates and etch rate ratios can be obtained by increasing the chlorine flow. For tungsten silicide, $WSi_x$, and molybdenum, $MoSi_x$, high etch rates and high etch rate ratios are attained by adding oxygenated or fluorinated dopants such as $NF_3$, $CF_4$, $O_2$, and $(CF_4+O_2)$. Thus, for example, the gas flow chemistries $HCl/BCl_3/Cl_2/CF_4$ and $HCL/BCl_3/Cl_2/O_2$ are particularly useful for etching tungsten silicide and molybdenum silicide, respectively.

During the polysilicon etch step, the $HCl/Cl_2$ gas chemistry provides high rate anistropic etching of the polysilicon with high selectivity to underlying oxides such as gate oxide layers 16. Selectivity to the organic photoresist mask 11 can be increased by increasing the chamber pressure. In more general terms, the process is consistent with the above-described requirements such as anisotropic polycide profiles, cleanliness, uniformity and reproducibility.

The process disclosed in the referenced Wang et al silicide etch patent application is similar to other prior art processes in that the photoresist 11 is used as the etch mask during the patterning of the polysilicon 14. See FIG. 2. However, the polysilicon-etching $HCl/Cl_2$ gas chemistry provides high selectivity to organic photoresist masks, which enhances mask pattern transfer to the polysilicon and preservation of the silicide during the poly etch.

SUMMARY OF THE INVENTION

It is an object of the present invention to provide an etching gas composition and an associated plasma RIE process for etching silicides of tungsten, molybdenum, titanium and tantalum using a reactant gas composition which suppresses etching of the silicide during the polysilicon etch and thereby enables use of the silicide as the polysilicon etch mask and renders the process independent of photoresist etching/erosion during the polysilicon etch.

In one aspect, the above and other objectives are satisfied in a process for etching a silicon component of a body comprising polycrystalline silicon and metal silicide components at a selected rate relative to the silicide, comprising exposing the body to a plasma formed from a reactant flow of $SiCl_4$ gas and hydrogenated chlorine-containing gas such as HCl, the volumetric concentration of $SiCl_4$ to HCl being chosen to provide the selected relative etch rate. Preferably, the volumetric ratio of $SiCl_4$ to HCl is at least about 1:1 and, more preferably, is about 2:1.

In another aspect, the above and other objectives are accomplished in a process for etching a tungsten polycide structure comprises a layer of tungsten silicide on a layer of polycrystalline silicon, using a photoresist etch mask for the silicide etch and the resulting patterned silicide as the polysilicon etch mask during patterning of the poly. The process comprises: communicating into an RIE plasma etching chamber containing the masked tungsten polycide sandwich structure a selected reactive gas mixture for forming a silicide etching plasma, while applying RF energy to the chamber to form the plasma and to etch the silicide to a pattern defined by the photoresist mask; and then communicating into the RIE plasma etching chamber a reactive gas mixture comprising silicon tetrachloride and hydrogen chloride for forming a polysilicon etching plasma, the silicon tetrachloride flow rate being equal to or greater than the hydrogen chloride flow rate for etching the polysilicon to the pattern defined in the silicide without etching the silicide.

DETAILED DESCRIPTION OF THE INVENTION

Figure 1:
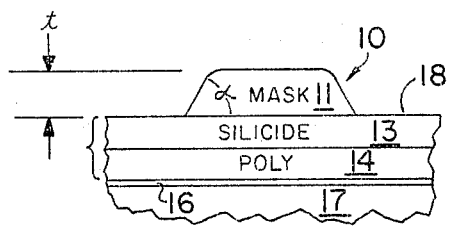
FIG. 1 is a schematized cross-sectional view of a polycide structure formed on a thin oxide layer over a silicon substrate, prior to etching using a photoresist mask.
Figure 2:
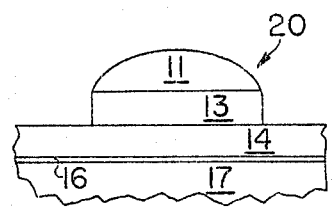
FIGS. 2 and 3 depict the sequence of etching the silicide and polysilicon layers, respectively, of FIG. 1.

The present invention encompasses a polycide etch process which suppresses silicide etching during the etching of the polysilicon layer and, thus, is able to use the silicide as the polysilicon etch mask. Dimensional aspects such as the line width of the silicide are maintained, and the silicide is not notched or otherwise degraded, during the polysilicon etching, regardless of the selectivity to the photoresist mask and of any degradation of the photoresist mask during the polysilicon etch.

My process is based on the discovery that chlorinated etching gas comprising silicon tetrachloride, SiCl$_4$, and hydrogen chloride, HCl, readily etches polysilicon at a relatively fast rate of about 500 Angstroms per minute without etching silicide, if the ratio of the silicon tetrachloride flow rate to the hydrogen chloride flow rate is at least about 1 to 1 and preferably, about 2 to 1. At and above this minimum flow rate concentration, the silicon tetrachloride substantially completely suppresses etching of the silicide such as tungsten silicide (e.g., the etch rate of tungsten silicide is $\leq 25$ Angstroms per minute). As a consequence, the silicide can be used effectively as the polysilicon etch mask. In addition to minimizing the dimensional loss of the silicide due to resist erosion, the process affords higher lithographic resolution, because the photoresist is used as an etch mask only during the tungsten silicide etching and a thinner and, therefore, more precisely patterned photoresist mask can be used.

The process which embodies the present invention is itself an improvement of a chlorinated gas chemistry developed by the assignee for etching polycides which uses a polysilicon etching gas comprising silicon tetrachloride and hydrogen chloride rather than the conventional silicon tetrachloride and chlorine composition. This chlorinated gas chemistry-based process typically comprises the following three steps and associated gas chemistry. First, the silicide is etched using the reactant gas combination HCl/BCl$_3$/Cl$_2$/CF$_4$ disclosed in the referenced Wang silicide/polycide etch process, at flow rate ratios of 100/50/50/25 sccm. Second, the main polysilicon etch step uses SiCl$_4$/HCl, rather than Cl$_2$/HCl, at a flow rate ratio of 50/50 sccm. Third, the polysilicon overetch uses HCl/O$_2$/He at 30/3/70 sccm. In the main poly etch step, the HCl is the primary polysilicon etchant while the silicon tetrachloride is used to increase photoresist selectivity and to etch the poly. In the poly overetch, the HCl is again the main poly etchant while the oxygen and the helium are used to increase the selectivity to the underlying gate oxide.

In relevant part, the objective of the above-identified chlorinated gas chemistry-based process was conventional to the extent that it used the photoresist as the mask during the polysilicon etch step and was designed to enhance selectivity to the mask, to thereby control erosion of the silicide during the poly etch step. Of course, despite the high selectivity to the mask, some photoresist erosion and resulting etching/notching of the underlying tungsten silicide occurred during the main polysilicon etch and the poly overetch. However, I discovered that the tungsten silicide/notching could be essentially completely suppressed during the main poly etch step (SiCl$_4$/HCl etching gas), by increasing the silicon tetrafluoride flow to the above-described concentrations relative to the hydrogen chloride. That is, at or above a requisite minimum SiCl$_4$ concentration, silicide etching was suppressed independent of the on-going mask erosion.

Regarding the poly overetch, it is not possible to suppress silicide etching when using the above-described oxygenated HCl/O$_2$/He reactant gas mixture. However, the application of essentially the same SiCl$_4$/HCl etching gas composition and concentration used in my new main poly etch at reduced flow rates, RF power, D.C. bias voltage and pressure levels has provided an excellent poly overetch which is characterized by adequate poly etch rate, high selectivity to oxide and high selectivity to silicide. Thus, the silicide can be used as a masking material for both the main polysilicon etch and the poly overetch. This extends current lithography/etching techniques to smaller linewidth resolutions.

Figure 3:
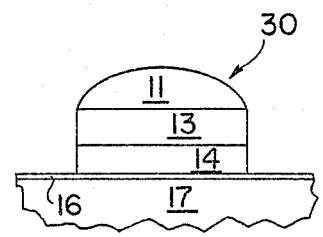
Figure 3A:
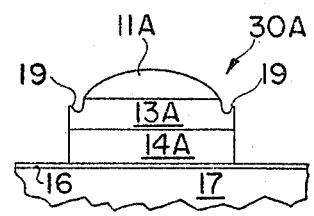
FIG. 3A schematically depicts the effect of photomask degradation on the underlying silicide structure during etching of the polysilicon underlayer.
Figure 3B:
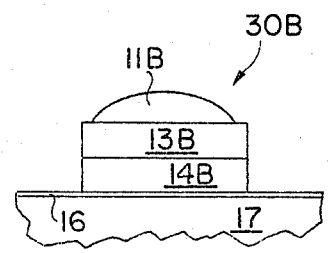
FIG. 3B schematically depicts the use of the present silicide etch-suppressing process and the effect of using the silicide as the poly etch mask.

The effect of the suppression of silicide etching is depicted schematically in FIG. 3B. Structure 30B of FIG. 3B is similar to structure 30A of FIG. 3A in that the photoresist mask 11B has eroded during the poly etch much in the manner of mask 11A, FIG. 3A. However, the use of the preferred silicide etch-suppressing polysilicon etchant gas composition (SiCl$_4$:HCl$\geq$1:1) has preserved the integrity of the silicide 13B so that the original pattern and dimensions of the mask 11 are preserved in silicide 13B and the silicide 13B functions as the etch mask for precisely replicating the original mask pattern in the poly layer 14B.

The suppression of the silicide etching using silicon tetrachloride is effective for hydrogenated chlorine-containing etchants such as hydrogen chloride, but is ineffective for non-hydrogenated chlorinated etchants such as chlorine, Cl$_2$, or boron trichloride, BCl$_3$. Furthermore, the suppression function becomes ineffective when even small volumetric amounts of dopants such as oxygen are present. For example, oxygen flow rates as low as about 5 volumetric percent of the total flow negates the silicide etch suppression by silicon tetrachloride.

Presently, in one preferred aspect, my present process uses a polysilicon etch in which the critical flow rate ratio SiCl$_4$:HCl$\geq$1:1 is used at first, relatively high values of RF power, D.C. bias, gas flow and/or chamber pressure to etch the polysilicon at a relatively high rate without etching the overlying silicide, followed by implantation of the polysilicon overetch using the critical silicon tetrachloride:hydrogen chloride flow rate ratio at a second, reduced RF power, D.C. bias, gas flow and/or pressure level to enhance the etch selectivity to the underlying oxide. In addition, prior to poly etch the above-described HCl/BCl$_3$/Cl$_2$/CF$_4$ etching gas composition can be used to etch the silicide at a relatively high rate of about 500 Angstroms per minute with a photoresist mask selectivity of about 2:1.

The presently preferred process parameters for implementing the tungsten polycide etch are disclosed in the Tables below.

| Process Parameters | Polycide RIE Etch | | |
|---|---|---|---|
| | Silicide Etch | Polysilicon Main Etch | Polysilicon Overetch |
| Total Gas Flow, sccm | 225 | 75 | 35 |
| BCl$_3$ | 50 | — | — |
| Cl$_2$ | 50 | — | — |
| CF$_4$ | 25 | — | — |
| SiCl$_4$ | — | 50 | 25 |
| HCl | 100 | 25 | 10 |
| SiCl$_4$:HCl Ratio | — | 2:1 | 2.5:1 |
| Chamber Pressure, mT | 35 | 30 | 10 |
| DC Bias, -volts d.c. | 300 | 300 | 175 |
| RF Power, watts | 1800 | 1600 | 550 |
| Silicide Etch Rate, Ang./min. | 500 | ~25 | <25 |
| Poly Etch Rate, | 400 | 450 | 250 |

| | Polycide RIE Etch | | |
|---|---|---|---|
| Process Parameters | Silicide Etch | Polysilicon Main Etch | Polysilicon Overetch |
| Ang./min. | | | |

Overetch Selectivity to Thermal Oxide: 15:1
Overall Selectivity to Resist: 2:1

In summary, the present process is exemplified in a simplified polycide etch process in which the same etching gas composition (SiCl$_4$:HCl≧1:1) is used for the main polysilicon etch and the polysilicon overetch without etching, notching or otherwise degrading the silicide. The silicide integrity is maintained for the entire etch process (silicide, polysilicon, overetch) and the silicide rather than the photoresist is used as the polysilicon etch mask, allowing the use of a relatively thin, more precisely patternable VLSI MOS photoresist mask. For example, in the above-mentioned process which formerly required a photoresist thickness, t, of 1.2 microns (12,000 Angstroms) and a sidewall angle, α, of 85° (see FIG. 1) the use of the present process reduces the minimum thickness and sidewall angle specifications to 0.8 micron (8,0000 Angstroms) and 65°.

The process parameters and results summarized in the Table above were obtained in the 8320 RIE plasma etching system which is available from Applied Materials, Inc. of Santa Clara, Calif. While the disclosed flow rates and other process parameters are for the 8320 reactor system, the critical silicon tetrachloride:hydrogen chloride flow rate ratio of ≧1:1 and preferably ≧2:1 is believed universally applicable to other etch reactor systems of different sizes and capabilities and will allow those of usual skill in the art to readily adapt the process to other systems that are capable of handling chlorinated chemistries.

Furthermore, it should be emphasized that the present process is not limited to the above-described process parameters. For example, chamber pressures of about 10 to 40 millitorr and RF power of about 400 to 2000 watts have been used successfully and it is anticipated that an even wider range of these and other parameters will provide substantially the benefits of the disclosed process.

Having thus described preferred and alternative embodiments of the present invention, what is claimed is:

1. A process for selectively etching a silicon constituent of a body formed of silicon and metal silicide constituents, substantially without etching of the silicide constituent, comprising exposing the body to a plasma formed from a reactant gas flow of SiCl$_4$ and HCl, the volumetric ratio of SiCl$_4$ to HCl being approximately ≧2 to 1.

2. A process for etching a tungsten polycide structure comprising a layer of tungsten silicide on a layer of polycrystalline silicon using a photoresist etch mask, in an RIE plasma etching chamber, comprising:
   positioning the masked tungsten polycide structure in the etch chamber;
   communicating into said chamber a selected reactive gas mixture for forming a silicide etching plasma, while applying RF energy to the chamber to form the plasma and to etch the silicide to a pattern defined by said photoresist mask; and
   communicating into said chamber a reactive gas mixture comprising silicon tetrachloride and hydrogen chloride for forming a polysilicon etching plasma, the flow rate ratio of silicon tetrachloride to hydrogen chloride being approximately ≧2 to 1 for etching the polysilicon to the pattern defined in the silicide without etching the silicide.

3. A process for etching, in a plasma etching chamber, a tungsten polycide structure comprising a layer of tungsten silicide on a layer of polysilicon on a layer of silicon oxide, using a photoresist on the silicide for patterning the silicide mask, and using the resulting patterned silicide as a mask for patterning the poly, comprising:
   communicating into said chamber, containing the masked tungsten polycide structure, a selected reactive gas mixture for forming a silicide etching plasma and applying RF energy to the chamber to form the plasma and etch the silicide to a pattern defined by said photoresist mask;
   communicating into said chamber a reactive gas mixture comprising silicon tetrachloride and hydrogen chloride for forming a polysilicon etching plasma, and forming said polysilicon etching plasma using selected RF power, D.C. bias voltage and pressure levels, the flow rate ratio of silicon tetrachloride to hydrogen chloride being approximately ≧2 to 1 for etching the polysilicon to the pattern defined in the silicide without substantially etching the silicide; and
   upon exposure of the underlying silicon oxide, reducing at least one of total gas flow rates, RF power, D.C. bias voltage and pressure to complete the etching of the polysilicon without substantially etching the tungsten silicide layer and without etching through the oxide.

4. The process of claim 3, wherein the polysilicon etching completion step is at reduced total gas flow, RF power, D.C. bias voltage and pressure levels.

5. The process of claim 3, wherein said silicide-etching reactive gas mixture comprises hydrogen chlorine, boron trichloride, chlorine and carbon tetrafluoride.

6. The process of claim 5, wherein the polysilicon etching completion step is at reduced total gas flow, RF power, D.C. bias voltage and pressure levels.

* * * * *